US 012546816B2

(12) United States Patent
Igarashi

(10) Patent No.: US 12,546,816 B2
(45) Date of Patent: Feb. 10, 2026

(54) SEMICONDUCTOR DEVICE

(71) Applicant: RENESAS ELECTRONICS CORPORATION, Tokyo (JP)

(72) Inventor: Mitsuhiko Igarashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 141 days.

(21) Appl. No.: 18/483,850

(22) Filed: Oct. 10, 2023

(65) Prior Publication Data

US 2024/0159598 A1   May 16, 2024

(30) Foreign Application Priority Data

Nov. 16, 2022 (JP) ................... 2022-183256

(51) Int. Cl.
*G01R 31/28* (2006.01)
*G01K 7/42* (2006.01)
*G06F 11/30* (2006.01)

(52) U.S. Cl.
CPC ........... *G01R 31/2874* (2013.01); *G01K 7/42* (2013.01); *G06F 11/3058* (2013.01)

(58) Field of Classification Search
CPC ............................................... G01K 2007/422
See application file for complete search history.

(56) References Cited

U.S. PATENT DOCUMENTS

| | | | |
|---|---|---|---|
| 7,282,975 B2 * | 10/2007 | Burton | G06F 1/04 327/544 |
| 9,000,850 B2 * | 4/2015 | Chuang | H03K 19/017581 326/82 |
| 9,106,230 B1 * | 8/2015 | Wang | H03K 19/1737 |
| 9,940,992 B2 * | 4/2018 | Atallah | G11C 7/06 |
| 10,361,685 B2 | 7/2019 | Takeuchi et al. | |
| 10,382,034 B2 * | 8/2019 | Zhong | G06F 1/3206 |
| 10,458,857 B2 * | 10/2019 | Rachala | G06F 1/3296 |
| 10,459,478 B1 * | 10/2019 | Savoj | G11C 7/04 |
| 10,594,303 B2 * | 3/2020 | Choi | G01K 7/32 |
| 11,528,017 B1 * | 12/2022 | Goffman-Vinopal | H03K 3/02335 |
| 11,616,473 B2 * | 3/2023 | Higuchi | H03B 5/04 331/57 |
| 2018/0156859 A1 * | 6/2018 | Takeuchi | G01R 31/2817 |

FOREIGN PATENT DOCUMENTS

JP   2017-118414 A   6/2017

OTHER PUBLICATIONS

Office Action dated May 14, 2025, issued in corresponding German Patent Application No. 102023131793.8, 13 pages.

* cited by examiner

*Primary Examiner* — Thomas J. Hiltunen
(74) *Attorney, Agent, or Firm* — Rimon P.C.

(57) ABSTRACT

A semiconductor device includes: a local sensor including a transistor, arranged in proximity to a measurement target region in a semiconductor chip, and outputs a leak current of the transistor as a sensor signal according to a temperature in the measurement target region; a conversion circuit arranged on the semiconductor chip, and converting the sensor signal from the local sensor into a digital count value; and a circuit block arranged between the local sensor and the conversion circuit in the semiconductor chip when viewed in a plan view.

18 Claims, 8 Drawing Sheets

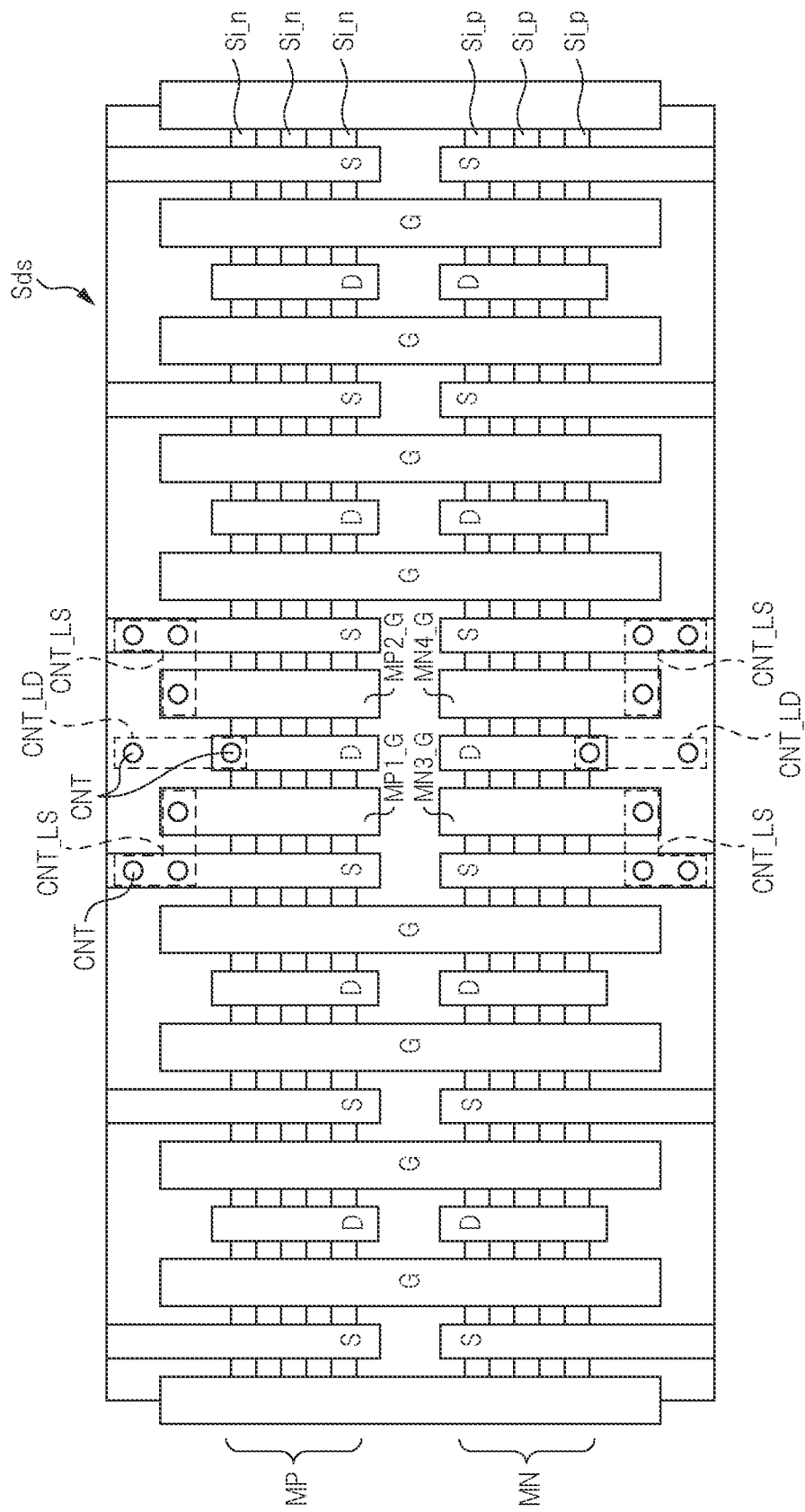

SEMICONDUCTOR DEVICE

CROSS-REFERENCE TO RELATED APPLICATIONS

The present application claims priority from Japanese Patent Application No. 2022-183256 filed on Nov. 16, 2022, the content of which is hereby incorporated by reference to this application.

BACKGROUND

The present invention relates to a semiconductor device, for example, a semiconductor device manufactured by a three-dimensional semiconductor process.

In recent years, customer requirements for an operating speed, an operating time, and the like for a semiconductor device have become increasingly high, and design for ensuring reliability of the semiconductor device has become more stringent. In addition, with adoption of the three-dimensional semiconductor process, miniaturization of the semiconductor device is progressing, and the design for ensuring the reliability is becoming stricter.

As one example of the three-dimensional semiconductor process, a FinFET (Field Effect Transistor) process is present. The FinFET increases an amount of heat generated by self-heating due to its operation in comparison with a so-called planar FET. With the miniaturization, there is concern that this amount of heat generated by the self-heating will increase and a reliability life of the semiconductor device will decrease.

There is a disclosed technique listed below.
[Patent Document 1] Japanese Unexamined Patent Application Publication No. 2017-118414

Patent Document 1 discloses a technique for predicting wear-out failures as the reliability life of the semiconductor device.

SUMMARY

In order to prevent deterioration of the reliability life of the semiconductor device, the present inventor has studied how to measure the self-heating of the FET with high accuracy.

It is known to form a temperature sensor on a semiconductor chip that configures the semiconductor device and measure a temperature of the semiconductor chip. In this case, the temperature sensor is a global temperature sensor that measures an average temperature of the semiconductor chip. The global temperature sensor has a problem that even if a temperature of a local region in the semiconductor chip rises due to the self-heating of the FinFET, it is difficult to measure the temperature rise with high accuracy.

In order to measure the temperature of the local region at a transistor level in the semiconductor chip, it is necessary to place the temperature sensor near the local region. As a configuration of the temperature sensor, a sensor that measures a threshold value of the FET (Vt measurement type), a sensor that measures a current flowing through a connection region (PN junction) between a P-type semiconductor region and an N-type semiconductor region (PN_Junction type), a sensor that uses a Kelvin resistance, a sensor that uses a plurality of bipolar transistors (PTAT current type), and the like are present.

In the Vt measurement type and the PN_Junction type, it is necessary to obtain a current-voltage curve in advance and convert a measured value by the current-voltage curve. Therefore, it is not realistic to mount them on the semiconductor chip. In addition, the PTAT current type requires the plurality of bipolar transistors, so that an occupied area of the temperature sensor increases.

The sensor that uses the Kelvin resistance can reduce the occupied area and can be arranged in proximity to the local region. However, measuring a minute potential difference between both end of the Kelvin resistance is necessary, so that the sensor is susceptible to noise.

That is, there is a problem in which the configuration as described above is not suitable for measuring the temperature of the local region at the transistor level in the semiconductor chip.

The local region with high self-heating correspond to a region where the FinFET with its high average power density is arranged. That is, the region where such a FinFET that its repetition of the on/off is rapid and/or that a flowing current is large is arranged correspond to the region where the self-heating is large. It is assumed that a circuit block using the FinFET with such a high average power density corresponds to a clock buffer and/or a clock inverter that have/has a high activation rate and a large load capacity.

The circuit block can be configured by, for example, combining a plurality of standard cells. In this case, in the design of the semiconductor device, after a layout design for arranging the circuit block, a clock signal layout design for supplying clock signals to the circuit block is usually performed. Therefore, a clock buffer and/or a clock inverter with a high activation rate and a large load capacity are identified after the clock signal layout design is completed. It is difficult to add and place the temperature sensor whose occupied area is large after the identification, and it is also conceivable to require being re-implemented from the layout design for placing the circuit block is required in order to place the additional temperature sensor.

Patent Document 1 does not disclose measuring the self-heating with high accuracy, and does not also disclose measuring the temperature of the local region. Furthermore, the above-mentioned problem is not also described in Patent Document 1.

The following is a brief description of an outline of the typical invention disclosed in the present application.

That is, a semiconductor device includes: a local sensor including a transistor, arranged in proximity to a measurement target region in a semiconductor chip, and outputs a leak current of the transistor as a sensor signal according to a temperature in the measurement target region; a conversion circuit arranged on the semiconductor chip, and converting the sensor signal from the local sensor into a digital count value; and a circuit block arranged between the local sensor and the conversion circuit in the semiconductor chip when viewed in a plan view.

Other problems and novel features will be apparent from the description of the present specification and the accompanying drawings.

According to one embodiment, the semiconductor device capable of suppressing the deterioration of the reliability life can be provided. Further, according to one embodiment, the semiconductor device capable of measuring the self-heating of the FinFET with high accuracy can be provided.

BRIEF DESCRIPTION OF THE DRAWINGS

FIG. 6 is a plan view showing a configuration of a standard cell according to a third embodiment.

DETAILED DESCRIPTION

Figure 1:
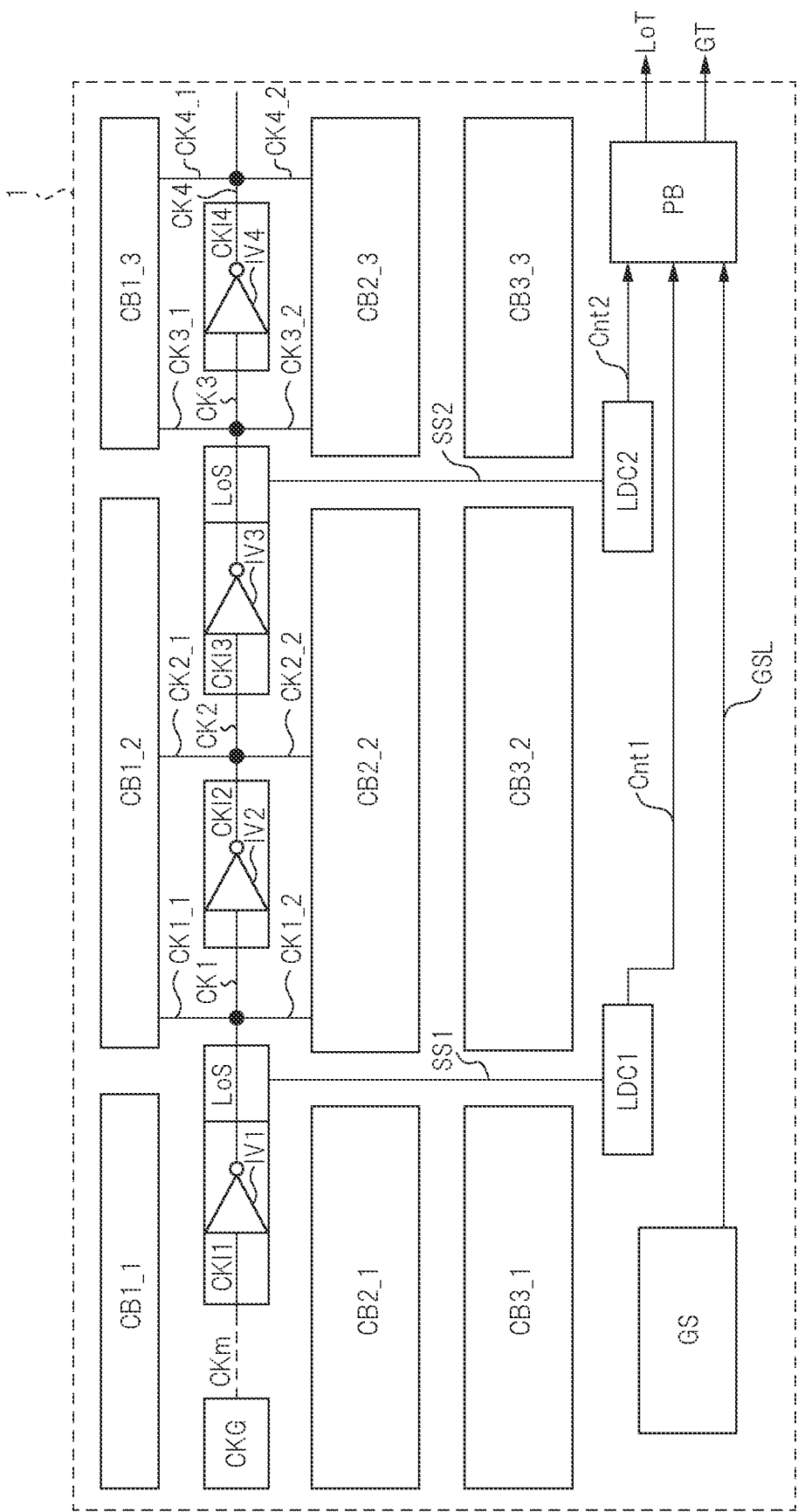
FIG. 1 is a block diagram showing a configuration of a semiconductor device according to a first embodiment.

Hereinafter, each embodiment of the present invention will be described with reference to the drawings. It should be noted that the disclosure is merely an example and that an invention at which those skilled in the art can easily arrive by appropriate modification within the scope of the invention belongs to, of course, the scope of the present invention.

In addition, in this specification and each figure, the same reference numerals are given to the same components as those described above with respect to the existing figures, and a detailed description thereof will be omitted as appropriate.

Figure 8:
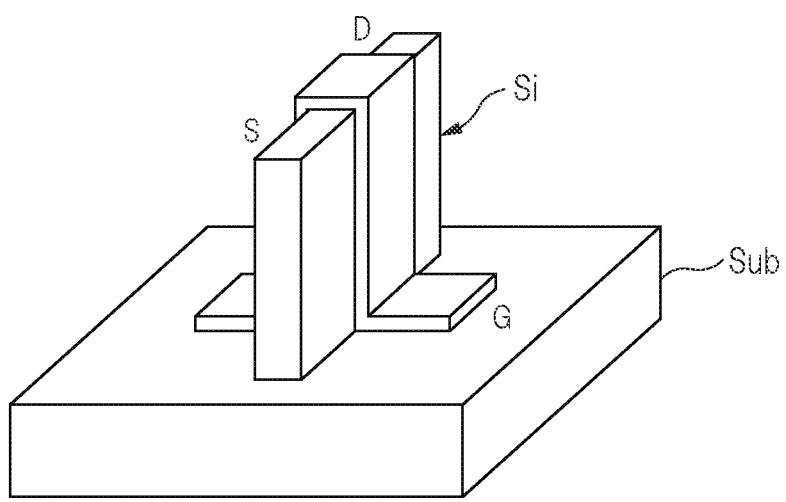
FIG. 8 is a schematic perspective view showing a structure of a FinFET.

In embodiments described below, a semiconductor device manufactured by a FinFET process will be described as an example. Therefore, before describing the embodiments, a structure of a FinFET will be described first. FIG. 8 is a schematic perspective view showing a structure of a FinFET. In FIG. 8, Sub denotes a substrate of a semiconductor chip. The substrate Sub includes, for example, a silicon (Si) region and an oxide film (not shown) formed on a main surface of the silicon region. A semiconductor region (for example, silicon) Si is three-dimensionally arranged on the main surface of the substrate Sub, and a gate electrode G of the FinFET is arranged so as to partially cover the semiconductor region Si. A semiconductor region (Fin) protruding from both sides of the gate electrode G functions as a drain region and a source region of the FinFET and is connected to a drain electrode D and a source electrode S.

A plurality of circuit blocks configured of such a FinFET and other elements are arranged on the semiconductor chip, and the semiconductor device that achieves a predetermined function is configured.

First Embodiment

FIG. 1 is a block diagram showing a configuration of a semiconductor device according to a first embodiment. In FIG. 1, 1 denotes the semiconductor device. FIG. 1 is a plan view of the semiconductor chip configuring the semiconductor device 1 as viewed from above the main surface thereof.

A large number of circuit blocks are arranged on the semiconductor chip, but only some of the circuit blocks CB1_1 to CB3_3 are shown in FIG. 1 in order to avoid complicating the drawing. Incidentally, although not shown in FIG. 1, the circuit blocks CB1_1 to CB3_3 are connected to each other by a signal wiring(s) so that a signal(s) can be transmitted and received.

Although not particularly limited, the circuit blocks CB1_2, CB2_2, CB1_3, and CB2_3 operate in synchronization with clock signals. That is, the circuit block CB1_2 operates in synchronization with clock signals CK1_1 and CK2_1, and the circuit block CB2_2 operates in synchronization with clock signals CK1_2 and CK2_2. Similarly, the circuit block CB1_3 operates in synchronization with clock signals CK3_1 and CK4_1, and the circuit block CB2_3 operates in synchronization with clock signals CK3_2 and CK4_2.

The clock signals CK1_1 to CK4_1 and CK1_2 to CK4_2 are formed by a clock generation circuit CKG and clock inverters CKI1 to CKI4. That is, the clock generation circuit CKG generates a master clock signal CKm. The master clock signal CKm is inverted by the clock inverter CKI1 and is supplied to the circuit blocks CB1_2 and CB2_2 as the clock signals CK1_1 and CK1_2. Also, a clock signal CK1 from the clock inverter CKI1 is supplied to the clock inverter CKI2. The clock inverter CKI2 inverts the clock signal CK1 and is supplies to the circuit blocks CB1_2 and CB2_2 as the clock signals CK2_1 and CK2_2.

Similarly, a clock signal CK2 from the clock inverter CKI2 is supplied to the clock inverter CKI3. The clock inverter CKI3 inverts the clock signal CK2 and supplies it as the clock signals CK3_1 and CK3_2 to the circuit blocks CB1_3 and CB2_3. Furthermore, a clock signal CK3 from the clock inverter CKI3 is supplied to the clock inverter CKI4. he clock inverter CKI4 inverts the clock signal CK3 and supplies it as the clock signals CK4_1 and CK4_2 to the circuit blocks CB1_3 and CB2_3.

Although FIG. 1 shows an example in which the master clock signal CKm is supplied in order to the clock inverters CKI1 to CKI4, the present embodiment is not limited to this. That is, for example, the master clock signal CKm may be supplied in parallel to all or some of the clock inverters CKI1 to CKI4.

In FIG. 1, the clock inverters CKI1 to CKI4 are shown as such an example as to have the inverters IV1 to IV4, but are not limited to those. That is, all or some of the clock inverters CKI1 to CKI4 may be clock buffers that buffer and output the supplied clock signal. The inverters IV1 to IV4 are configured of a plurality of FinFETs. For example, the inverter IV1 includes a P-channel FinFET (hereinafter, also referred to as a P-type transistor) and an N-channel FinFET (hereinafter, also referred to as an N-type transistor) connected in series between a power supply voltage and a ground voltage. The clock buffer has, for example, two inverters whose inputs and outputs are connected in series.

In FIG. 1, LoS denotes a temperature sensor. The temperature sensor LoS is arranged near the clock inverters CKI1 and CKI3. More specifically, referring to FIG. 1, the temperature sensor LoS is arranged adjacent to the clock inverters CKI1 and CKI3. The temperature sensor LoS measures a temperature of a local region where the adjacent clock inverters CKI1 and CKI3 are arranged, and outputs sensor signals SS1 and SS2 according to the measured temperature.

In FIG. 1, GS is a temperature sensor that measures the temperature of the semiconductor chip. The temperature sensor GS outputs a sensor signal GSL of a digital value corresponding to an average temperature of the entire semiconductor chip. Since the temperature sensor GS outputs the sensor signal GSL corresponding to the average temperature of the entire semiconductor chip, it can also be regarded as a global temperature sensor (global sensor). In contrast, the temperature sensor LoS can be regarded as a local temperature sensor (local sensor) since it outputs the sensor signals SS1 and SS2 according to the temperature of adjacent local region. In the following, the temperature sensor LoS will be referred to as the local sensor and the temperature sensor GS will also be referred to as the global sensor.

The sensor signals SS1 and SS2 outputted from the local sensor LoS are supplied to conversion circuits LDC1 and LDC2 that are arranged away from the clock inverters CKI1 and CKI3 and the local sensor LoS. Taking FIG. 1 as an example, when viewed in a plan view, the two circuit blocks (for example, CB2_1 and CB3_1, CB2_2 and CB3_2) are arranged between the clock inverters IKI1, CKI3 and local sensors LoS and the conversion circuits LDC1, LDC2 and when viewed in a plan view, intervals therebetween are separated. Of course, the number of circuit blocks arranged therebetween is not limited to two, and may be one or three or more.

The conversion circuits LDC1 and LDC2 convert the sensor signals SS1 and SS2 into digital count signals Cnt1 and Cnt2, and supply them to a processing circuit PB. The sensor signal GSL outputted from the global temperature sensor GS is also supplied to the processing circuit PB. Although not particularly limited, the processing circuit PB processes the digital count signal Cnt1 and/or Cnt2, generates local temperature information LoT, and outputs it to an outside of the semiconductor device 1. Similarly, although not particularly limited, the processing circuit PB processes the sensor signal GSL, generates global temperature information GT, and outputs it to the outside of the semiconductor device 1.

Outside the semiconductor device 1, the global temperature information GT and the local temperature information LoT are used to control a temperature of an environment in which the semiconductor device 1 is installed. This makes it possible to suppress deterioration of the reliability life of the semiconductor device.

The FinFET configuring the clock inverter (or clock buffer) has the high activation rate since it operates according to the supplied clock signal. In addition, since driving the circuit blocks and the like, the FinFET configuring the clock inverter (or clock buffer) has the large load capacity. Therefore, in the semiconductor chip, the region where the clock inverter (clock buffer) is arranged corresponds to the local region where the self-heating is large.

In the semiconductor device 1 according to the first embodiment, the local sensor LoS is arranged in a region proximate to the region where the clock inverter (clock buffer) is arranged. That is, in FIG. 1, the local sensor LoS is arranged adjacent to the clock inverters CKI1 and CKI3. As a result, it is possible to output, as the local temperature information LoT, the temperature of the local region with the large self-heating.

Also, the conversion circuits LDC1 and LDC2 are arranged in a region away from the local sensor LoS. That is, when viewed in a plan view, the conversion circuits LDC1 and LDC2, whose occupied areas become large, are physically separated from the local sensor LoS and can be arranged in the region of the semiconductor chip which has a margin when viewed in a plan view.

The average temperature of the semiconductor chip from the global temperature information GT can be grasped, but a temperature change in the local region due to the self-heating of the FinFET is difficult to grasp by the global temperature information GT. According to the first embodiment, the local sensor LoS measures the temperature change in the local region with high accuracy, and outputs it as the local temperature information LoT. By using this local temperature information LoT, the temperature of the external environment of the semiconductor device 1, for example, is controlled according to the temperature change in the local region due to the self-heating, thereby making it possible to suppress the deterioration of the reliability life of the semiconductor device. Also, since only the local sensor LoS is arranged near the local region, an increase in the occupied area of the circuit that measures a local temperature can be suppressed.

Local Sensor and Conversion Circuit

Figure 2A:
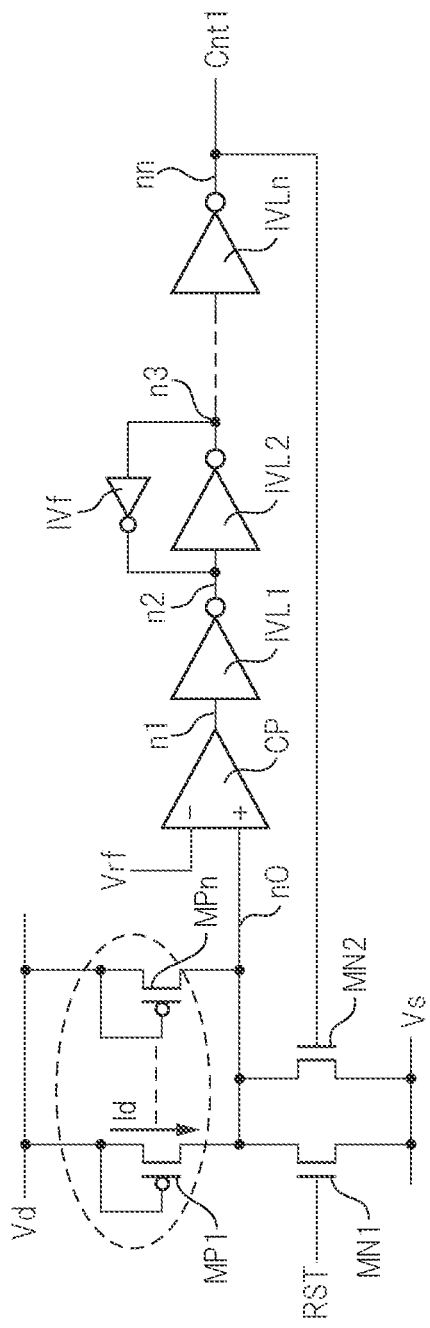
FIG. 2A is a diagram for explaining a local sensor and a conversion circuit according to the first embodiment.
Figure 2B:
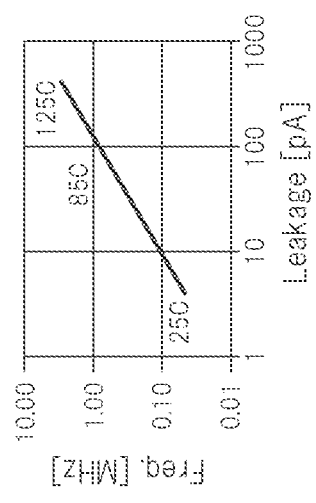
FIG. 2B is a diagram for explaining the local sensor and the conversion circuit according to the first embodiment.

Next, configuration examples of the local sensor and the conversion circuit according to the first embodiment will be described. FIGS. 2A and 2B are diagrams for explaining the local sensor and the conversion circuit according to the first embodiment. Here, FIG. 2A is a circuit diagram showing configurations of the local sensor and the conversion circuit. Although the local sensor and the conversion circuit are arranged separately on the semiconductor chip as shown in FIG. 1, they are integrally drawn in FIG. 2A to show the configurations. Further, FIG. 2B is a characteristic diagram for explaining operations of the local sensor and the conversion circuit. Since the conversion circuits LDC1 and LDC2 shown in FIG. 1 have the same configuration, the conversion circuit LDC1 will be described as an example here.

In FIG. 2A, MP1 to MPn denote P-type transistors, and MN1 and MN2 denote N-type transistors. Although not particularly limited, the P-type transistors MP1 to MPn and the N-type transistors MN1 and MN2 are configured by the FinFETs as shown in FIG. 8.

Each of the P-type transistors MP1 to MPn has a gate electrode and a source region connected to a power supply voltage Vd, and a drain region connected to a node n0. That is, each of n (1 to n) P-type transistors MP is diode-connected and connected in parallel between the power supply voltage Vd and the node n0. Source regions of the N-type transistors MN1 and MN2 are connected to the ground voltage Vs, and drain regions thereof are connected to the node n0. That is, source-drain paths of the N-type transistors MN1 and MN2 are connected in parallel between the node n0 and the ground voltage Vs.

The node n0 is connected to a positive input terminal (+) of a comparator circuit CP. A predetermined reference voltage Vrf is supplied to a negative input terminal (−) of the comparison circuit CP. The comparator circuit CP compares a voltage of the node n0 with the reference voltage Vrf, and outputs a voltage according to a comparison result to a node n1. As shown in FIG. 2A, a plurality of inverters IVL1 to IVLn are connected in series between the node n1 and a node nn. Incidentally, although not particularly limited, a small inverter IVf for feedback is connected between an input and an output of the inverter IVL2. The digital count signal Cnt1, which is an output signal of the conversion circuit LDC1, is outputted from the node nn. Also, the node nn is connected to a gate electrode of the N-type transistor MN2.

A reset signal RST is supplied to a gate electrode of the N-type transistor MN1. The reset signal RST is not particularly limited, but is changed to a high level before the local temperature is measured by the processing circuit PB shown in FIG. 1 and is changed to a low level when the local temperature is measured.

When the N-type transistor MN2 is turned off by setting the reset signal RST to the low level, a leak current flows from the power supply voltage Vd through the P-type transistors MP1 to MPn connected in parallel. In FIG. 2A, the leakage current flowing through the P-type transistor MP1 is indicated by the reference numeral ld. By the leak current ld flowing, charges (or discharges) a parasitic capacitance associated with the node n0 is charged (or discharged), and a time required for the voltage of the node n0 to reach the reference voltage Vrf changes according to a value of the leak current. As a result, timing at which an output voltage of the comparison circuit CP changes is changed.

The inverter is substantially configured by the N-type transistor MN2 and the P-type transistors MP1 to MPn. Since an output of the inverter IVLn is fed back to this inverter, a ring oscillator is configured by this inverter and the inverters IVL1 to IVLn in this inverter. By changing the timing at which the output voltage of the comparison circuit CP changes, an oscillation frequency of the ring oscillator changes.

The leakage current ld flowing through the parallel-connected P-type transistors MP1 to MPn changes depending on the temperature of the region where the P-type transistors MP1 to MPn are arranged. Therefore, a frequency (count value) of the digital count signal Cnt1 changes depending on the temperature of the region where the P-type transistors MP1 to MPn are arranged.

FIG. 2B shows a relationship among the leak current, the frequency of the digital count signal Cnt1, and the temperature of the region where the P-type transistors MP1 to MPn are arranged. That is, in FIG. 2B, a horizontal axis indicates the leak current, and a vertical axis indicates the frequency. When the temperature of the region where the P-type transistors MP1 to MPn are arranged changes from 25° C., 85° C., and 125° C., the leakage current increases and the frequency becomes also high, as shown in FIG. 2B. That is, the frequency linearly becomes high as the temperature rises.

In a configuration shown in FIG. 2A, the local sensor LoS is configured by the P-type transistors MP1 to MPn connected in parallel, and conversion circuit LDC1 is configured by the N-type transistors MN1 and MN2, the comparator circuit CP, and the inverters IVL1 to IVLn and IVf, and arranged separately on the semiconductor chip. Incidentally, the parallel-connected P-type transistors MP1 to MPn can be regarded as sensor transistors for measuring the temperature.

Separate Arrangement of Local Sensor and Conversion Circuit

Figure 3:
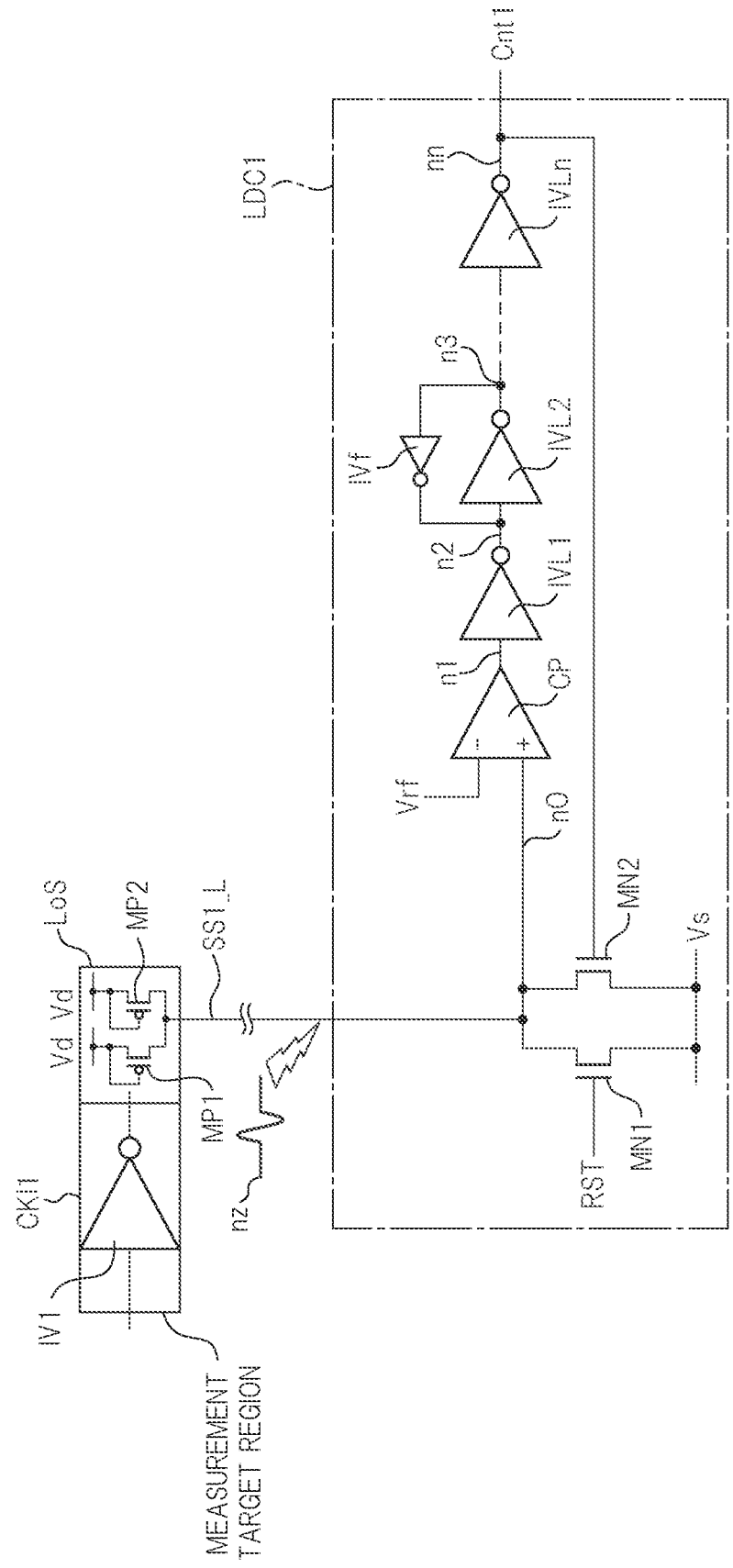
FIG. 3 is a diagram for explaining a separate arrangement of the local sensor and the conversion circuit according to the first embodiment.

Next, a separate arrangement of the local sensor and the conversion circuit on the semiconductor chip will be described. FIG. 3 is a diagram for explaining the separate arrangement of the local sensor and the conversion circuit according to the first embodiment.

The P-type transistors MP1 and MP2 that configure the local sensor LoS are arranged in proximity to the region where the clock inverter CKI1 is arranged, that is, a measurement target region where the temperature locally changes due to the self-heating of the FinFET. The conversion circuit LDC1 is arranged in a region away from a region where the measurement target region and the local sensor LoS are arranged. A signal wiring SS1_L, which is electrically connected between the drain regions of the N-type transistors MN1 and MN2 configuring the conversion circuit LDC1 and the drain regions of the P-type transistors MP1 and MP2, is arranged between the circuit blocks, for example, between the circuit blocks CB2_1, CB3_1 and CB2_2, CB3_2 in FIG. 1 when viewed in a plan view. Here, an example in which the signal wiring SS1_L is arranged between the circuit blocks when viewed in a plan view has been described, but the present embodiment is not limited to this. For example, the signal wiring SS1_L may overlap with the circuit block(s) when viewed in a plan view.

The sensor signal SS1 is transmitted from the local sensor LoS to the conversion circuit LDC1 by this signal wiring SS1_L. More specifically, a temperature-dependent leak current flows through the signal wiring SS1_L. The conversion circuit LDC1 converts a time required for the voltage of the node n0 to reach the reference voltage Vrf due to the leak current into the frequency of the digital count signal Cnt1. That is, the conversion circuit LDC1 converts an integrated value of the leak current into the frequency of the digital count signal Cnt1.

Since the circuit block is arranged near the signal wiring SS1_L, it is conceivable that noise nz is transmitted to the signal wiring SS1_L due to crosstalk or the like from the circuit block to the signal wiring SS1_L. Even in this case, time of the noise nz is shorter than charging time of parasitic capacitance due to the leakage current, so that an adverse effect due to the noise nz is minor. In addition, when a voltage of the noise nz fluctuates up and down, the leak current also fluctuates in accordance with this change. However, since the up-and-down fluctuation of the leakage current is canceled, the adverse effect on the integral value is minor.

Although FIG. 1 shows an example in which the local sensors LoS are arranged adjacent to only the two clock inverters CKI1 and CKI3 among the four clock inverters, the present embodiment is not limited to this. For example, if the self-heating of each of the four clock inverters CKI1 to CKI4 is considered to be large, the local sensor LoS may be arranged adjacent to each of the clock inverters CKI1 to CKI4.

In addition, although FIG. 1 shows an example in which the local sensor LoS and the conversion circuit are arranged one-to-one, the present embodiment is not limited to this. For example, a selection circuit may be provided in the conversion circuit LDC1 to select one of the sensor signals SS1 and SS2 and convert the selected sensor signal into the digital count signal.

Modification Example

Figure 4:
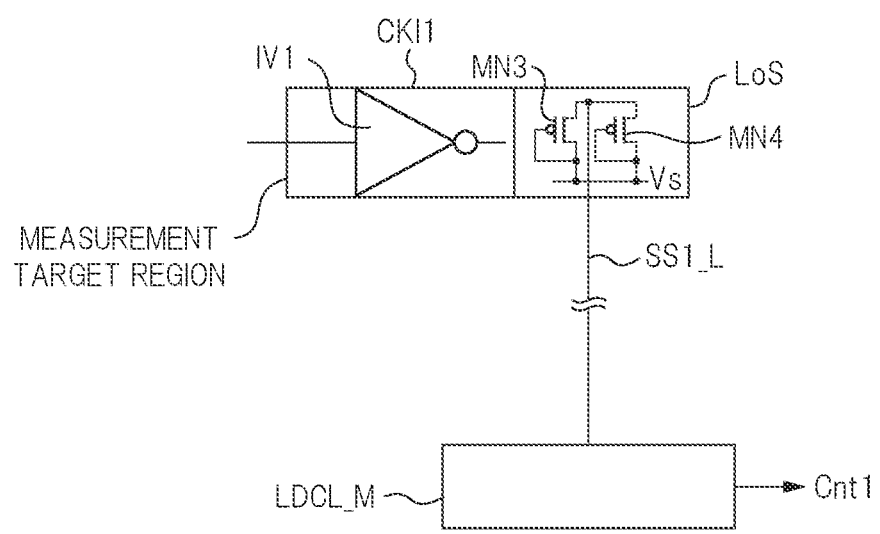
FIG. 4 is a circuit diagram showing a configuration of a local sensor and a conversion circuit according to a modification example of the first embodiment.

FIG. 4 is a circuit diagram showing configurations of a local sensor and a conversion circuit according to a modification example of the first embodiment. FIG. 4 is similar to FIG. 3. A main difference therebetween is that the transistor and the conversion circuit configuring the local sensor LoS are changed.

That is, the transistor configuring the local sensor LoS is changed from the P-type transistor to the N-type transistors MN3 and MN4. The gate electrodes and the source regions of the N-type transistors MN3 and MN4 are connected so as to be diode-connected. The source regions of the N-type transistors MN3 and MN4 are connected to the ground voltage Vs, and the respective drain regions are connected to a conversion circuit LDCL_M via the signal wiring SS1_L.

A configuration of the conversion circuit LDCL_M is changed from the configuration shown in FIG. 3 since the N-type transistor is used as a sensor transistor. For example, the P-type transistor is used instead of the N-type transistors MN1 and MN2 shown in FIG. 3, and the source-drain path of the P-type transistor is connected between the node n0 (FIG. 3) and the power supply voltage Vd.

Consequently, the digital count signal Cnt1 of the frequency, which corresponds to the leakage current flowing through the sensor transistors MN3 and MN4 according to the temperature of the measurement target region, is outputted from the conversion circuit LDCL_M.

Although FIGS. 3 and 4 show an example in which the two transistors are used as the sensor transistor, the present embodiment is not limited to this. For example, the number of sensor transistors may be one, or three or more.

Second Embodiment

In a second embodiment, a case where the circuit block or the like arranged on the semiconductor chip is configured by combining one or more standard cells will be described. Incidentally, although shown in later drawings, the standard cell includes a plurality of P-type transistors and N-type transistors.

Also in the second embodiment, the semiconductor device will be described so as to have the configuration shown in FIG. 1. In this case, although not particularly limited, the circuit blocks CB1_1 to CB3_3, the clock generation circuit CKG, and the clock inverters CKI1 to CKI4 shown in FIG. 1 are configured by combining the standard cell or the plurality of standard cells. Of course, the conversion circuits LDC1, LDC2, the processing circuit PB, and the global sensor GS may also be configured by the plurality of standard cells.

Figure 5A:
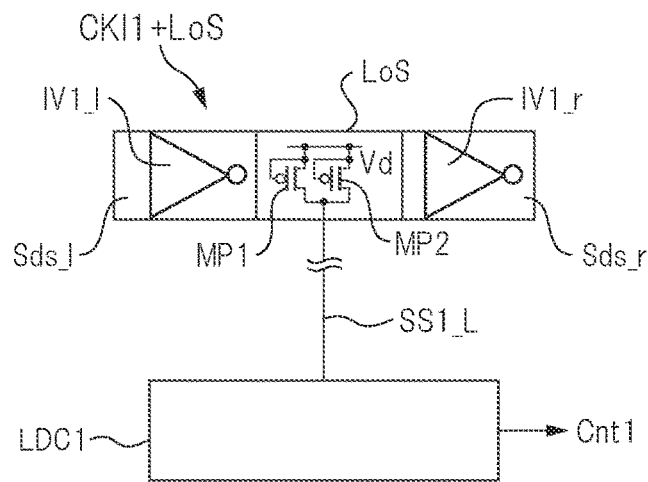
FIG. 5A is a diagram for explaining a semiconductor device according to a second embodiment.
Figure 5B:
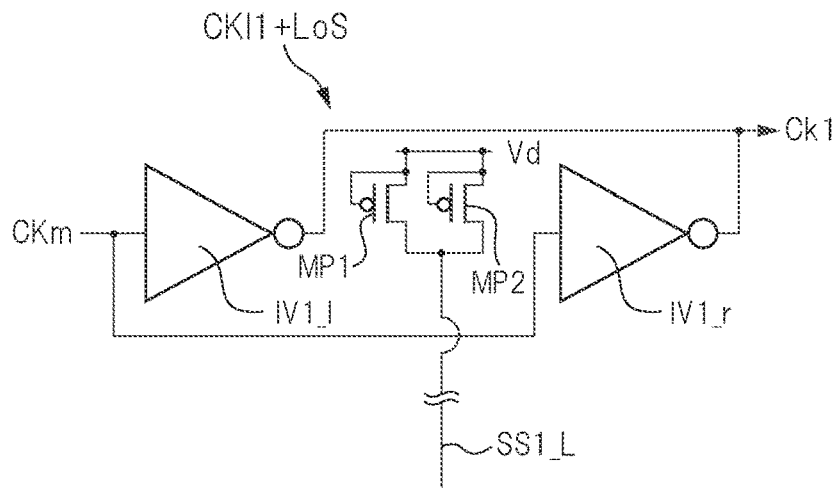
FIG. 5B is a diagram for explaining the semiconductor device according to the second embodiment.
Figure 5C:
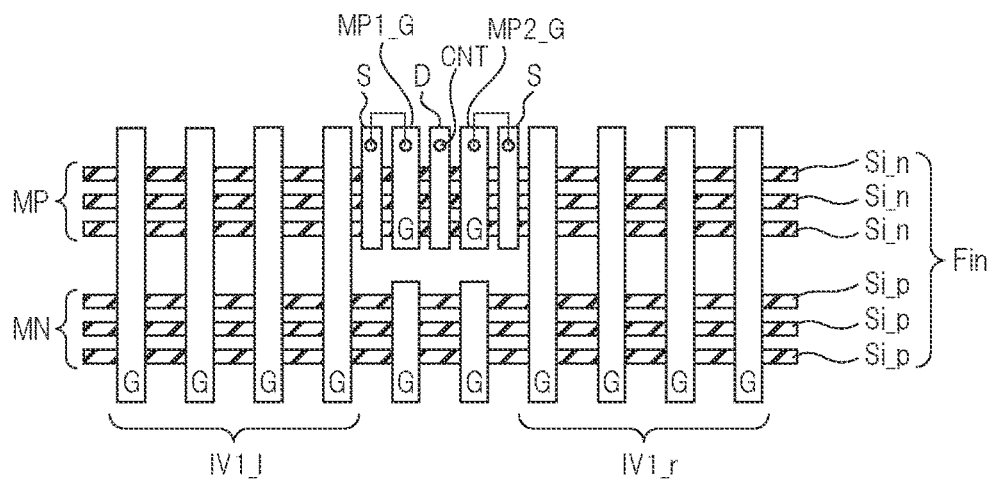
FIG. 5C is a diagram for explaining the semiconductor device according to the second embodiment.

FIG. 5 is a diagram for explaining a semiconductor device according to a second embodiment. FIG. 5 shows portions (CKI1+LoS) corresponding to the clock inverter CKI1 and the local sensor LoS shown in FIG. 5. Here, FIGS. 5A and 5B show the configuration of the clock inverter CKI1 configured by the two standard cells, and FIG. 5C is a plan view when viewed from above the main surface of the semiconductor chip.

As shown in FIG. 5A, the clock inverter CKI1 is configured by combining two standard cells Sds_1 and Sds_r that are arranged in proximity to each other when viewed from a plan view. In the standard cells Sds_1 and Sds_r, inverters IV1_1 and IV1_r are configured by the P-type transistor and the N-type transistor that are respectively arranged. The inverter IV1 shown in FIG. 1 is configured by these two inverters IV1_1 and IV1_r.

The local sensor LoS is embedded between the standard cells Sds_1 and Sds_r so as to be arranged adjacent to the standard cells Sds_1 and Sds_r when viewed in a plan view. That is, the sensor transistors MP1 and MP2 configuring the local sensor LoS are arranged between the standard cells Sds_1 and Sds_r. The drain regions of the sensor transistors MP1 and MP2 are connected to the conversion circuit LDC1 through the signal wiring SS1_L as shown in FIG. 5A.

Although not particularly limited, the inverters IV1_1 and IV1_r are connected in parallel as shown in FIG. 5B. That is, the inputs of the two inverters IV1_1 and IV1_r are commonly connected, and the outputs thereof are also commonly connected to the node n0.

In FIG. 5C, the region of the reference numeral IV1_1 denotes a region in which the P-type transistor (MP) and the N-type transistor (MN) configuring the inverter IV1_l are arranged, and the region of the reference numeral IV1_r denotes a region in which the P-type transistor (MP) and the N-type transistor (MN) configuring the inverter IV1_r are arranged. Further, in FIG. 5C, the reference numeral G denotes the gate electrodes of the P-type transistor and the N-type transistor. As described with reference to FIG. 8, the gate electrodes are arranged so as to partially cover the semiconductor regions Si n and Si p. Although not shown in FIG. 5C, the source electrode and the drain electrode for extracting the source region and the drain region are arranged in the Fin region protruding from the gate electrode G. Incidentally, the semiconductor regions Si_n and Si_p are arranged so as to extend in a lateral direction in FIG. 5C.

In the second embodiment, as shown in FIG. 5C, gate electrodes MP1_G and MP2_G of the sensor transistors MP1 and MP2 are arranged between the transistors configuring the inverters IV1_1 and IV1_r when viewed in a plan view. The gate electrodes MP1_G and MP2_G are also arranged so as to partially cover the semiconductor regions Si_n and Si_p. Further, a source electrode S is arranged between the gate electrodes MP1_G and MP2_G and the gate electrodes G of the transistors adjacent to the gate electrodes MP1_G and MP2_G among the transistors configuring the inverters IV1_1 and IV1_r and above the semiconductor region Si_n, and is connected to the semiconductor region Si_n. Furthermore, a drain electrode D is arranged between the gate electrodes MP1_G and MP2_2 and above the semiconductor region Si_n, and is connected to the semiconductor region Si_n.

As shown in FIG. 5C, the gate electrodes MP1_G and MP2_G of the sensor transistors are respectively connected to the corresponding source electrodes S, and the drain electrode D of the sensor transistor is connected to the signal wiring SS1_L as shown in FIGS. 5A and 5B.

Consequently, the temperature that changes due to the self-heating of the P-type and N-type transistors configuring the inverters IV1_1 and IV1_r is measured by the leak current of the sensor transistor.

Incidentally, in FIG. 5C, although not particularly limited, the source electrode S is not arranged between the gate electrodes MP1_G and MP2_G and the gate electrodes G of the transistors adjacent to the gate electrodes MP1_G and MP2_G and above the semiconductor region Si_p. Also, the drain electrode D is not arranged between the gate electrodes MP1_G and MP2_G and above the semiconductor region Si_p. However, the source electrode S and the drain electrode D may also be arranged above the semiconductor region Si_p and connected to the semiconductor region Si_p. As described in the modification example of the first embodiment, when the N-type transistor is used as the sensor transistor, the source electrode S arranged on the semiconductor region Si_p is connected to the corresponding gate electrode, and the drain electrode D may be connected to the signal wiring SS1_L.

As shown in FIG. 5C, the P-type transistors MP1 and MP2 used as the sensor transistors share the drain region. Therefore, at least two transistors are used as the sensor transistor.

Incidentally, when the standard cells Sds_1 and Sds_r are regarded as cells, the first standard cell including the cells Sds_1 and Sds_r can be considered to be arranged in the measurement target region and the local sensor can be considered to be embedded between the cells. When considered in this way, the circuit blocks CB1_1 to CB3_3 can be considered to be configured by second standard cells.

Third Embodiment

In the second embodiment, an example in which the local sensor is arranged between the standard cells arranged in the measurement target region has been described, but in the third embodiment, an example in which the local sensor is embedded in the standard cell will be described. That is, one standard cell has the local sensor.

FIG. 6 is a plan view showing a configuration of a standard cell according to a third embodiment. In FIG. 6, Sds denotes the standard cell. In FIG. 6, G denotes the gate electrodes of the P-type transistor (MP) and the N-type transistor, S denotes the source electrodes of the P-type transistor (MP) and the N-type transistor, and D denotes the P-type transistor (MP) and the N-type transistor, and D denotes the drain electrodes of the P-type transistor (MP) and the N-type transistor. Si_n and Si_p denote the semiconductor regions and extend laterally in FIG. 6. As described with reference to FIG. 8, the gate electrode is arranged to cover parts of the semiconductor regions Si_p and Si_n, and the source electrode S and the drain electrode D arranged on both sides of the gate electrode G are arranged on and are connected to the semiconductor regions Si_p and Si_n. A predetermined circuit, for example, the clock inverter CKI1 described with reference to FIG. 1 and the like is configured by the plurality of P-type transistors and N-type transistors each having the gate electrode G, the source electrode S, and the drain electrode D.

In FIG. 6, the P-type transistors MP1 and MP2 or the N-type transistors MN3 and MN4 that configure the sensor transistor are embedded in the standard cell Sds. Although both the P-type transistor and the N-type transistor that can be used as the sensor transistors are shown in FIG. 6, a case where the P-type transistors MP1 and MP2 are used as the sensor transistor will be here described as an example.

As shown in FIG. 6, the gate electrodes MP1_G and MP2_G of the P-type transistors MP1 and MP2 are arranged on the semiconductor region Si_n and between the source electrodes S of the P-type transistors. The common drain electrode D of the P-type transistors MP1 and MP2 is arranged between the gate electrodes MP1_G and MP2_G. The common drain electrode D is connected to a wiring CNT_LD by a contact CNT, and the wiring CNT_LD is connected to the conversion circuit LDC1 via the signal wiring SS1_L shown in FIG. 1, for example. In this case, the wiring CNT_LD, the contact CNT, or the common drain electrode D can be regarded as the terminal of the local sensor LoS.

The gate electrodes MP1_G and MP2_G are connected to the adjacent source electrodes S by the wiring CNT_LS and the contacts CNT. For example, the power supply voltage Vd is supplied to the source electrode S. Consequently, the leakage current according to the temperature of the standard cell Sds flows through the terminal of the local sensor LoS, and the digital count signal according to the temperature of the standard cell Lds is outputted from the conversion circuit LDC1.

As described in the modification example of the first embodiment, when the N-type transistors MN3 and MN4 are used as the sensor transistors, as shown in FIG. 6, the gate electrodes MN3_G and MN4_G of the N-type transistors Mn3 and MN4 arranged on and above the semiconductor region Si_p are connected to the adjacent source electrodes S. Further, the common drain electrode D of the N-type transistors MN3 and MN4 is connected to the wiring CNT_LD, and the wiring CNT_LD is connected to the conversion circuit LDC1 as the terminal of the local sensor LoS.

Incidentally, the source electrode S of the sensor transistor is also used as the source electrode of the adjacent transistor.

For example, in designing the semiconductor device 1 shown in FIG. 1, the circuit blocks CB1_1 to CB3_3 are initially arranged, then the clock inverters CKI1 to CKI4 and the like are arranged, and then the signal wiring is arranged and connected by an automatic arrangement wiring so as to supply the clocks outputted from the clock inverters CKI1 to CKI4 to the corresponding circuit blocks. When the clock inverters CKI1 to CKI4 are configured by using the standard cells, the clock inverters to be arranged in the region where the self-heating is to be observed are configured by the standard cells including the local sensor LoS, and the other clock inverters are configured by the standard cells including no local sensor. In this case, the signal wiring is arranged and connected by the automatic arrangement wiring so that the terminal of the local sensor LoS in the standard cell is connected to the conversion circuit LDC1.

By using the standard cell including the local sensor LoS separated from the conversion circuit, the increase in the occupied area of the clock inverter can be suppressed. In addition, since the separated conversion circuit and local sensor LoS can be connected by a technique such as the automatic arrangement wiring, the design of the semiconductor device can be prevented from being complicated due to use of the standard cell including the local sensor LoS.

Fourth Embodiment

In a fourth embodiment, an example in which the standard cell configuring the local sensor LoS is arranged between the standard cells that are physically adjacent to each other when viewed in a plan view will be described. Here, an example in which the adjacently arranged standard cells (cells) are not physically separated but are electrically separated will be described.

Figure 7:
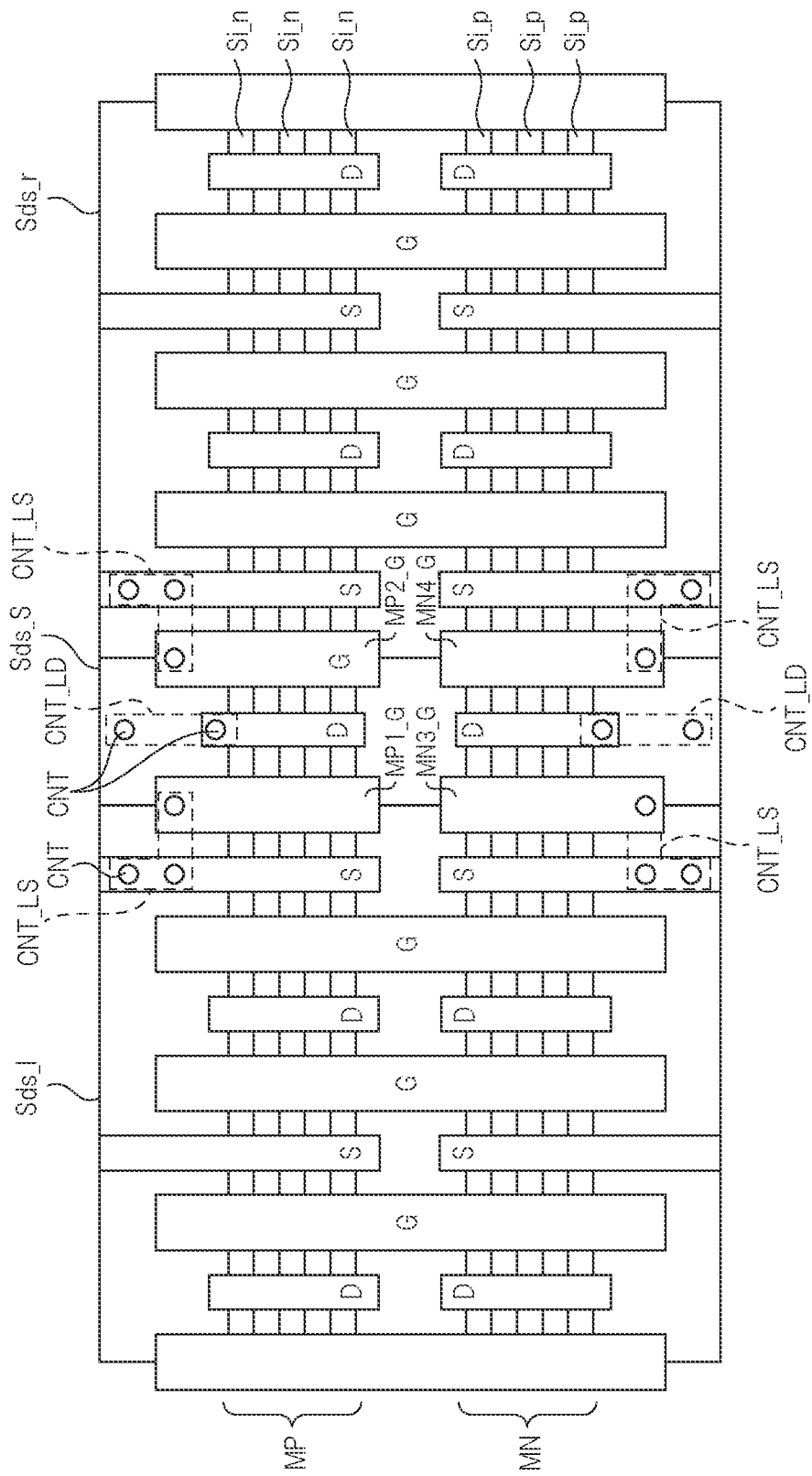
FIG. 7 is a plan view showing a configuration of a standard cell according to a fourth embodiment.

FIG. 7 is a plan view showing a configuration of a standard cell according to a fourth embodiment. Since FIG. 7 is similar to FIG. 6, differences therebetween will be mainly described. While the one standard cell including the local sensor LoS is shown in FIG. 6, FIG. 7 shows two standard cells Sds_1, Sds_r and one custom standard cell SDs_S that configures the local sensor LoS. The standard cell Sds_S can be regarded as a sensor cell since it is a cell that measures the local temperature.

State where no Custom Standard Cell SDs_S is arranged

For ease of explanation, it is assumed that the inverters IV1_1 and IV1_r shown in FIG. 5B are configured by the standard cells Sds_1 and Sds_r. If the local sensor LoS is not arranged, no standard cell Sds_S is formed. In a state where no standard cell Sds_S is formed, the drain electrode D arranged between the gate electrodes MP1_G and MP2_G and the drain electrode D arranged between the gate electrodes MN3_G and MN4_G are not formed. Also, the contacts CNT and the wirings CNT_LS and CNT_LD are not formed. In this case, the gate electrodes MP1_G, MP2_G, MN3_G and MN4_G function as gate electrodes of dummy transistors. Such a voltage that the dummy transistors become OFF states is applied to the gate electrodes of these dummy transistors. Consequently, even though the semiconductor regions Si_n and Si_p are shared between the standard cells Sds_1 and Sds_r, the standard cells Sds_1 and Sds_r are electrically separated from each other.

Formation of Standard Cells Sds_S

In the fourth embodiment, as shown in FIG. 7, the drain electrode D is formed between the gate electrodes MP1_G and MP2_G and is connected to the semiconductor region Si_n. Further, through the contacts CNT, the gate electrodes MP1_G and MP2_G and the corresponding source electrodes S are connected by the wiring CNT_LS, and the drain electrode D arranged between the gate electrodes MP1_G and MP2_G is connected to the wiring CNT_LD by the contacts CNT. Consequently, the standard cell Sds_S having the P-type transistors MP1 and MP2 including the gate electrodes MP1_G and MP2_G is formed.

The wiring CNT_LD is connected, as the terminal of the local sensor LoS, to the conversion circuit LDC1 by the signal wiring SS1_L as shown in FIG. 3, for example. The conversion circuit LDC1 outputs the digital count signal Cnt1 corresponding to the temperature due to the self-heating of the P-type and N-type transistors formed in the standard cells Sds_1 and Sds_r.

In FIG. 7, the drain electrode D is also arranged between the gate electrodes MN3_G and MN4_G and is connected to the semiconductor region Si_p. Also, the gate electrodes MN3_G and MN4_G and the drain electrode D are connected to the corresponding wirings CNT_LS and CNT_LD. As shown in the modification example of the first embodiment, when the N-type transistor is used as the sensor transistor, the wiring CTN_LD connected to the drain electrode D arranged between the gate electrodes MN3_G and MN4_G may be used as the terminal of the local sensor LoS.

Although FIG. 7 shows the standard cell Sds_S in which each of the P-type transistor and the N-type transistor can be used as the sensor transistor, the present embodiment is not limited to this. For example, when only the P-type transistors are used as the sensor transistors, the drain electrode D may not be formed between the gate electrodes MN3_G and MN4_G and the wirings CNT_LS and CNT_LD may not be formed. In this case, the gate electrodes MN3_G and MN4_G may be set so that the dummy transistors having the gate electrodes become OFF states.

Although FIG. 7 shows an example in which the local sensor is provided (embedded) in the standard cells that are not physically separated, the present embodiment is not limited to this. By preparing, as one standard cell, the standard cell, in which the local sensor is embedded, ease of the wiring can be improved in the design of a semiconductor device using the standard cell and, at the same time, the temperature changes at the local region can be measured with high accuracy.

When the clock inverter CKI1 and the like are configured by using the standard cells, the occupied area occupied of the clock inverter CKI1 when viewed in a plan view becomes 3 to 25 times the minimum size of the standard cells. In contrast, the occupied area of the local sensor LoS configured by two sensor transistors does with 1 to 2 times the minimum size of the standard cell. Therefore, even if the local sensor LoS is arranged, the increase in the occupied area due to it can be suppressed. Incidentally, the occupied area of the conversion circuit is about 440 times the minimum size of the standard cell, but the conversion circuit can be arranged in an arbitrary region separated from the local sensor LoS. That is, the conversion circuit can be arranged in a region with sufficient margin.

In FIG. 1, when each of the clock inverters CKI1 to CKI4 is configured by the first standard cells and the circuit blocks CB1_1 to CB3_3 are configured by the second standard cells, it can be considered to show that the local sensor is arranged in proximity to some first standard cells among the plurality of first standard cells.

The invention made by the present inventor has been specifically described above based on the embodiments, but the present invention is not limited to the above embodiments and, needless to say, can be variously modified without departing from the gist of the invention.

What is claimed is:

1. A semiconductor device comprising:
   a local sensor including a transistor, arranged in proximity to a measurement target region in a semiconductor chip, and outputs a leak current of the transistor as a sensor signal according to a temperature in the measurement target region;
   a conversion circuit arranged on the semiconductor chip, and converting the sensor signal from the local sensor into a digital count value; and
   a circuit block arranged between the local sensor and the conversion circuit in the semiconductor chip when viewed in a plan view,
   wherein a global sensor that outputs a sensor signal corresponding to an average temperature of the semiconductor chip is arranged on and above the semiconductor chip, and the average temperature measured by the global sensor is outputted as a digital value.

2. The semiconductor device according to claim 1,
   wherein the measurement target region includes a first standard cell, and the circuit block is configured by a second standard cell.

3. The semiconductor device according to claim 2,
   wherein the first standard cell includes a plurality of cells, and the local sensor is embedded between the plurality of cells when viewed in a plan view.

4. The semiconductor device according to claim 3,
   wherein each of the first standard cell and the second standard cell includes a plurality of transistors.

5. The semiconductor device according to claim 1,
   wherein the local sensor includes a diode-connected transistor as the transistor, and the leak current is a leak current that flows between predetermined voltages via the diode-connected transistor.

6. The semiconductor device according to claim 5,
   wherein the diode-connected transistor is a P-channel or N-channel type transistor.

7. The semiconductor device according to claim 1,
   wherein the local sensor includes a plurality of local sensors arranged in mutually different regions on and above the semiconductor chip when viewed in a plan view.

8. The semiconductor device according to claim 2,
   wherein the first standard cell includes two cells whose boundaries are not physically separated, and a drain electrode for extracting the sensor signal is arranged between the two cells.

9. The semiconductor device according to claim 2,
   wherein the second standard cell includes a plurality of second standard cells operating according to a plurality of clock signals, and
   wherein the first standard cell includes a plurality of first standard cells that generate the plurality of clock signals, and the local sensor is arranged in proximity to some of the plurality of first standard cells.

10. A semiconductor device comprising:
    a local sensor including a transistor, arranged in proximity to a measurement target region in a semiconductor chip, and outputs a leak current of the transistor as a sensor signal according to a temperature in the measurement target region;
    a conversion circuit arranged on the semiconductor chip, and converting the sensor signal from the local sensor into a digital count value; and a circuit block arranged between the local sensor and the conversion circuit in the semiconductor chip when viewed in a plan view, wherein the measurement target region includes a first standard cell, and the circuit block is configured by a second standard cell, and wherein the first standard cell includes a plurality of cells, and the local sensor is embedded between the plurality of cells when viewed in a plan view.

11. The semiconductor device according to claim 10, wherein each of the first standard cell and the second standard cell includes a plurality of transistors.

12. The semiconductor device according to claim 10, wherein the local sensor includes a diode-connected transistor as the transistor, and the leak current is a leak current that flows between predetermined voltages via the diode-connected transistor.

13. The semiconductor device according to claim 12, wherein the diode-connected transistor is a P-channel or N-channel type transistor.

14. The semiconductor device according to claim 10, wherein a global sensor that outputs a sensor signal corresponding to an average temperature of the semiconductor chip is arranged on and above the semiconductor chip, and the average temperature measured by the global sensor is outputted as a digital value.

15. The semiconductor device according to claim 14, wherein the local sensor includes a plurality of local sensors arranged in mutually different regions on and above the semiconductor chip when viewed in a plan view.

16. The semiconductor device according to claim 10, wherein the first standard cell includes two cells whose boundaries are not physically separated, and a drain electrode for extracting the sensor signal is arranged between the two cells.

17. The semiconductor device according to claim 10, wherein the second standard cell includes a plurality of second standard cells operating according to a plurality of clock signals, and wherein the first standard cell includes a plurality of first standard cells that generate the plurality of clock signals, and the local sensor is arranged in proximity to some of the plurality of first standard cells.

18. A semiconductor device comprising:

a local sensor including a transistor, arranged in proximity to a measurement target region in a semiconductor chip, and outputs a leak current of the transistor as a sensor signal according to a temperature in the measurement target region;

a conversion circuit arranged on the semiconductor chip, and converting the sensor signal from the local sensor into a digital count value; and a circuit block arranged between the local sensor and the conversion circuit in the semiconductor chip when viewed in a plan view, wherein the measurement target region includes a first standard cell, and the circuit block is configured by a second standard cell, and wherein the first standard cell includes two cells whose boundaries are not physically separated, and a drain electrode for extracting the sensor signal is arranged between the two cells.

* * * * *